(12) United States Patent
Braendle

(10) Patent No.: US 6,558,749 B2
(45) Date of Patent: May 6, 2003

(54) METHOD FOR MANUFACTURING A WORKPIECE WITH WEAR-PROTECTIVE COATING

(75) Inventor: Hans Braendle, Sargans (CH)

(73) Assignee: Unakis Balzers AG, Furstentum (LI)

( * ) Notice: Subject to any disclaimer, the term of this patent is extended or adjusted under 35 U.S.C. 154(b) by 0 days.

(21) Appl. No.: 10/101,579

(22) Filed: Mar. 20, 2002

(65) Prior Publication Data

US 2002/0136933 A1 Sep. 26, 2002

Related U.S. Application Data

(62) Division of application No. 09/242,707, filed on Apr. 22, 1999, now Pat. No. 6,395,379, which is a continuation of application No. PCT/CH97/00321, filed on Sep. 3, 1997.

(30) Foreign Application Priority Data

Sep. 3, 1996 (JP) .............................. 8-252384
Sep. 3, 1996 (JP) .............................. 8-252385

(51) Int. Cl.$^7$ .............................. B05D 7/00; C23C 14/00
(52) U.S. Cl. .............................. 427/419.7; 204/192.1; 204/192.15; 427/402; 427/419.1; 427/450; 427/454
(58) Field of Search .............................. 427/402, 419.1, 427/719.7, 450, 454; 204/192.1, 192.15

(56) References Cited

U.S. PATENT DOCUMENTS 5,330,853 A * 7/1994 Hofmann et al.
5,652,044 A * 7/1997 Rickerby
5,679,448 A * 10/1997 Kawata
5,750,207 A * 5/1998 Hammond et al.
5,882,777 A * 3/1999 Kukino et al.

FOREIGN PATENT DOCUMENTS

| EP | 592 986 | * | 4/1994 |
| JP | 6-8009 | * | 1/1994 |
| JP | 6-108254 | * | 4/1994 |

* cited by examiner

Primary Examiner—Archene Turner
(74) Attorney, Agent, or Firm—Notaro & Michalos P.C.

(57) ABSTRACT

Method for manufacturing a workpiece with wear protective coating starts with depositing a first hard material layer selected from the group consisting of TiN, TiCN, TiAlN, TiAlCN or the workpiece. Above the first hard material layer, a second hard material layer selected from the group consisting of TiN, TiCN, TiAlN, TiAlCN is deposited. The second layer is either deposited directly on the first layer or on a transition layer between the first and second layers. The transition layer is made of a material composed of the materials of the first and second layers, and has a thickness of between 5 nm and 500 nm. The first and second hard material layers have the same crystal structure, but different crystallographic privileged orientation with a value I(200)/I(111) between an intensity of the (111) plane, I(111), and an intensity of the (200) plane, I(200), of one of the first and second layers being at most 1 and the value of the other being at least 1. The values are thus different from each other.

42 Claims, No Drawings

METHOD FOR MANUFACTURING A WORKPIECE WITH WEAR-PROTECTIVE COATING

CROSS-REFERENCE TO RELATED APPLICATIONS

This application is a divisional of application Ser. No. 09/242,707, filed Apr. 22, 1999, now U.S. Pat. No. 6,395,379, which in turn is a continuation of international application no. PCT/CH97/00321, filed Sep. 3, 1997 on which priority was claimed based on Japanese application nos. 8/252384 and 8/252385, both filed on Sep. 3, 1996.

FIELD AND BACKGROUND OF THE INVENTION

The present invention relates to a workpiece, in particular tool, with wear-protective coating as well as a process for its manufacture.

To create a wear-protection system on workpieces, in particular on tools, in particular on steel and hard metal tools, it is known to apply hard material coatings, for example layers of TiN or TiCN onto the workpiece to protect. By hard metals are understood sintered carbides (cemented carbide). It is possible to increase the wear resistance, in particular the oxidation resistance, of said layers by adding aluminum. This is disclosed for example in JP-OS No. 4-53642/92 or 5-67705/93. It is further known to improve the properties of a wear-protective coating by forming a superlattice in connection with which reference is made, for example to JP-OS No. 7-97679/95.

The requirements made of the wear protection are increasing. Thus, for example, increasingly higher demands are made of tools with wear-protective coating in machining with respect to the attainable cutting speed in order to arrive thereby at higher throughputs or at greater efficiency.

In form working conventionally most often a soft steel was worked before the heat treatment. Today the form working is carried out only after the heat treatment, i.e. after the steel has been hardened.

In many cases, such as for example during high-speed machining, the oxidation resistance of the above mentioned coatings with aluminum addition is not satisfactory, for example for the machining working of hardened materials. This is the case even though, as mentioned, the addition of aluminum improves the properties in this regard, such as that of TiN or TiCN layers.

The stated wear-protective coatings are conventionally applied by vacuum coating processes, such as for example by ion plating or, if appropriate, also by CVD processes.

When applying these layers, such as for example through ion plating, the residual compressive stress increases proportionally to the thickness of the applied layer. Corresponding to the increase of the residual compressive stress the adhesion, or the adhesion to be considered under the aspect of the shearing load, between layer and workpiece body, in particular comprising steel or hard metal, decreases such that layer thicknesses of maximally 5 μm can be used. Since precisely during ion plating relatively pronounced residual compressive stresses remain, it is also known that due to this process workpieces with wear-protective coating are inferior compared to workpieces coated by means of chemical vapor deposition processes (CVD) in that when the last denoted process is used, due to the stated residual compressive stresses, layer thicknesses of 5 to 15 μm can be used.

If the hardness of the layer is increased through forming a superlattice, this does increase the wear resistance, but simultaneously such a hard layer has a high Young's modulus and very high residual compressive stresses, which forces the thickness of such a layer to be restricted merely to 3 to 5 μm. The occurrence of said high residual compressive stresses when coating with superlattice structures leads, moreover, also to problems of adhesion between layer and workpiece body.

SUMMARY OF THE INVENTION

It is the task of the present invention to propose a workpiece, in particular comprising steel or a hard metal, with wear-protective coating and a process for its manufacture, on which occur significantly decreased residual compressive stresses. Thus, the workpiece with wear-protective coating is to comprise a wear protection layer system which, while simultaneously increasing the wear resistance, and thus decreasing the adhesion problems, can be realized to be substantially thicker than has previously been the case. This is solved through the workpiece with wear-protective coating which is distinguished according to the characterizing clause of the claims.

It has accordingly been found that by providing a wear protection layer system with at least two successive layers, each with differing crystallographic privileged orientation, the posed task is solved. Thus, an increased layer thickness is realizable without the residual compressive stresses increasing correspondingly.

Preferred embodiments of the invention are described in the following.

DESCRIPTION OF THE PREFERRED EMBODIMENTS

A corresponding process operation of the coating process with materials suitable for wear protection yields in each instance a crystallographic privileged orientation in the crystal growth, such as, for example and in particular in PVD processes, therein in particular with reactive processes, such as with cathodic arc vaporization and sputtering. A layer produced for example through arc vaporization in general comprises a privileged orientation in crystal growth so that the layer is formed with a columnar crystal structure. As a rule, a columnar crystal particle is formed as a monocrystal which has grown in a specific direction and has very few defect loci. The crystals are lined up continuously and thus form a layer with the residual compressive stresses, as mentioned, increasing proportionally to the thickness of the layer. The invention is based on the findings that if two successive layers are deposited with differing crystallographic privileged orientations, a multiplicity of lattice defect loci are introduced at the interface between the layers. If, for example and preferably, a layer with privileged orientation to the (111) plane comprising TiN and a layer with privileged orientation to the (200) plane comprising TiCN or a layer with privileged orientation to the (111) plane comprising TiAlCN are layered pairwise as two- or multi-layer systems wherewith the layer interfaces are formed discontinuously and an epitaxial growth is prevented, the stated multiplicity of lattice defect loci is introduced at the layer interfaces. During the further layer growth, these lattice defects are oriented such that the residual compressive stress is decreased over the entire layer system. A residual compressive stress equalization zone between said layers is virtually formed. Thus the formation of a collectively thick layer or a layer system with low residual compressive stress becomes possible.

Said layers are therein preferably each produced of one of the following materials:

TiN, TiCN, TiAlN, TiAlCN, either of the same material or preferably of differing said materials.

A TiAlN layer with a privileged orientation to the (200) plane having a thickness of 0.5 μm has a residual compressive stress of 1.2 GPa while the residual compressive stress in a TiAlN layer having a thickness of 10 μm and identical orientation already exceeds 8 GPa and its adhesion is correspondingly worse. But if a 0.5 μm thick TiALN layer with privileged orientation to the (200) plane and a 0.5 μm TiN layer with privileged orientation to the (111) plane are applied alternately for the formation of a wear protection layer system, and specifically multilayered, for example up to a thickness of 10 μm, surprisingly a remaining residual compressive stress of maximally 2 GPa results.

As is evident, in a preferred embodiment the differing privileged orientation is realized by using differing layer materials, with identical or differing control of a vacuum coating process. But it is entirely possible to deposit the layers with differing privileged orientation of one and the same layer material, however, by means of differing process control.

As layer material pairs are preferred:

TiN/TiN
TiN/TiCN
TiN/TiAlN
TiN/TiAlCN
TiCN/TiCN
TiCN/TiAlN
TiCN/TiAlCN
TiAlN/TiAlN
TiAlN TiAlCN
TiAlCN/TiAlCN and in each of the denoted combinations of preferably differing materials the one or the other layer can be applied as the first layer onto the workpiece.

Among the layer combinations with differing materials, preferred as stated, are especially preferred the combinations:

TiN/TiAlN
TiCN/TiAlCN or, if appropriate,

TiN/TiAlCN
TiCN/TiAlN

As coating processes are especially preferred reactive or non-reactive PVD processes, and in particular reactive processes, in particular cathodic arc vaporization and sputtering.

The workpieces, preferably comprising a steel or a hard metal, are preferably tools, therein in particular forming or press tools, in particular preferred indexable inserts, end-milling tools, in particular drills or milling cutters, further gear cutting tools and saw blades.

With the workpiece with wear-protective coating according to the invention, such as in particular the just described wear protection system of 10 μm and greater thickness, formed by multiple pairing it is also prevented, for example during machining application of a workpiece according to the invention implemented as a tool, that the cracks generated during the machining on the surface of the layer expand in the interfaces between the layers. The stress concentration occurring at the crack projection is reduced through the multiplicity of lattice defects on said interface which interface thus forms a pronounced resistance against the further conveyance of cracks. Should the cracks nevertheless become greater, they are not conveyed into the basic body but rather only extend along the interfaces between said layers so that notches on cutting edges are largely prevented.

If cracks could spread unchecked along the interfaces between the layers this would entail the danger that individual layers of the wear protection layer system could become detached which would also lead to an impairment of the wear resistance. But, it has been found in the case of all denoted layer material pairs and, in particular, in the case of the preferred ones, for example with the combination of TiN and TiAlN or of TiCN and TiAlCN that the cracks precisely cannot spread unchecked along the interfaces between the layers. The reason for this is, in principle, probably because, due to the differing privileged orientation according to the invention and thus the high density of discontinuities in the layer transition region, a spreading of the crack in this transition region is decisively prevented.

As a result, it is found that a workpiece with wear-protective coating according to the invention, due to the layer system thickness provided, has a high wear resistance with the cracks hardly propagating through the wear protection layer system, i.e. the wear protection layer system has a high degree of toughness. Therewith, with the workpiece according to the invention, compared with workpieces with wear protection systems without privileged orientation change between the layers, not only an increased layer system thickness can be used but, with thin layer systems, compared to previously known systems, for example compared with tools with identical thickness of a uniform layer, a significantly extended service life is attained.

Definition

I(XXX) indicates the intensity of the (XXX) plane, measured by means of X-ray diffraction according to the θ-2θ method.

The value of the quotient I(200)/I(111) of one of the layers, for example comprising TiAlN or TiAlCN, is selected to be at least 1 since with higher (111) privileged orientation a higher residual compressive stress results on this layer, which is undesirable. But if this layer has a (200) privileged orientation, the residual compressive stress of the layer is kept low. For this reason, this layer requires a (200) privileged orientation by which means said quotient is preferably selected to be at least 1. This applies in particular to layers of one of the materials comprising Al.

To introduce lattice defects on the interface between the one layer and the other, the latter should have the reverse privileged orientation. Consequently, in the above described example the other layer, for example comprising TiN or TiCN, should have a (111) privileged orientation by which means preferably a quotient I(200)/I(111) should be maximally 1 at this layer, but, in any event, not be equal to the quotient for the first mentioned layer.

If the total thickness of the layer system is less than 1 μm, such a layer system has only a negligible wear protection effect. If, on the other hand, the total thickness of the layer system exceeds 15 µm, problems could arise with respect to adhesion on the basic steel body, wherewith the wear protection layer system preferably is at least 1 µm thick and preferably maximally 15 µm.

Axial cutting depth: 18 mm

Radial cutting depth: 6 mm

Dry, cut-down milling

TABLE 1

| Sample No. | | Total Thickness of Layer (µm) | Number of Layers | TiN I(200)/ I(111) | TiAlN I(200)/ I(111) | Service Life of Tool (m) | |
|---|---|---|---|---|---|---|---|
| | | | | | | Hard Metal Indexable Inserts | HSS End-Milling Cutters |
| Inv. | 1 | 8 | 16 | 0.5 | 1.5 | 5.7 | 48.8 |
| | 2 | 8 | 16 | 0.5 | 8.2 | 6.8 | 52.1 |
| Expls. | 3 | 8 | 16 | 0.1 | 1.5 | 8.9 | 51.3 |
| | 4 | 8 | 16 | 0.1 | 8.2 | 12.5 | 46.2 |
| | 5 | 13 | 26 | 0.5 | 8.2 | 22.8 | 88.5 |
| | 6 | 5 | 10 | 0.5 | 6.3 | 4.2 | 32.3 |
| | 7 | 3 | 8 | 0.5 | 6.3 | 1.7 | 22.5 |
| | 8 | 10 | 20 | 0.1 | 10.2 | 7.8 | 55.5 |
| | 9 | 10 | 20 | 0.1 | 15.1 | 8.9 | 57.8 |
| | 10 | 10 | 40 | 0.1 | 15.1 | 11.2 | 58.2 |
| Comp. | 11 | 3 | 1(TiN) | 0.5 | — | 0.8 | 8.3 |
| | 12 | 10 | 1(TiN) | 0.5 | — | 0.5 | 1.5 |
| Expls. | | | | | | (Splitting Off) | (Broken-Out) |
| | 13 | 3 | 1(TiAl)N | — | 10.2 | 1.5 | 21.2 |
| | 14 | 10 | 1(TiAl)N | — | 10.2 | 0.5 | 10.2 |
| | | | | | | | (Broken -Out) |

EXAMPLE 1

Hard metal indexable inserts according to JIS P40 and commercially available HSS shank-type milling cutters were coated by cathodic arc vaporization by means of Ti target and TiAl target (Ti/Al=50/50) and layer systems according to the invention were formed according to Table 1. In the comparison examples TiN or TiAlN layers were applied as monolayer systems according to the same process, namely cathodic arc vaporization.

The coated hard metal indexable inserts were tested under the Machining Conditions No. 1 reproduced below until the wear on the open space had reached 0.3 mm. The machining length was determined as the service life criterion.

The coated HSS shank milling cutters were tested according to the Machining Conditions No. 2, also described below, until the wear on the open space had reached 0.2 mm. The machining length was also determined as the service life criterion. The results are listed in Table 1.

Machining Conditions No. 1
 For hard metal indexable inserts (SEE 42-TN)
  Material to be machined: X 40 CrMoV51 (DIN 1.2344), DAC(HRC40)
  Cutting rate: 100 m/min
  Advance: 0.1 mm/tooth
  Cutting depth: 2 mm
  Dry working
Machining Conditions No. 2
 For HSS end-milling cutters
  Material to be machined: 40 CrMoV51 (DIN 1.2344), DAC(HRC10)
  Cutting rate: 50 m/min
  Advance: 0.07 mm/tooth As can be seen in the above Table 1, in the steel bodies with wear-protective coating in the form of said tools with a total wear protection layer system thickness of far more than 10 µm (Example 5 according to the invention), the residual compressive stress is contained such that no splitting off of the layer is generated and no notch formation occurs on the cutting edge, and this is accomplished over very long service lives, compared to the comparison examples with only monolayer wear protection layer systems.

In a further development of the invention, between the layers a transition layer of 5 nm to 500 nm was provided, in which both materials of the adjacent layers are present, thus with adjoining layers of TiN and TiAlN layers these two stated materials, and, analogously, in the case of TiCN and TiAlCN layers, the corresponding two materials. Thereby the tendency of cracks spreading along the layer interfaces is even more effectively abated.

If the thickness of the transition layer is 5 nm or less, no effect against the cracks extending along the interfaces is attainable, and if it exceeds 500 nm, the layers tends to epitaxial growth, for example of the Ti nitride or—carbon nitride and TiAl nitride or—carbon nitride, respectively, so that the value I(200)/I(111) is not readily controllable. The thickness of the transition layer is therefore limited to 5 nm up to 500 nm.

In the following Table 2 the results attained with this further development are shown in comparison to results with tools protected with monolayer wear protection, in which again the coating techniques and machining test conditions described in Example 1 were used.

The transition layer was created through simultaneous cathodic arc vaporization from the corresponding Ti targets or Ti-Al targets, respectively. As in the embodiment example 1, the layers were generated by reactive cathodic arc vaporization in a reactive gas atmosphere comprising nitrogen.

TABLE 2

| | Sample No. | Total Thickness of Layer (μm) | Number of Layers | TN I(200)/ I(111) | Thickness of Transition | TiAlN I(200)/ I(111) | Service Life of Tool (m) | |
|---|---|---|---|---|---|---|---|---|
| | | | | | | | Hard Metal Indexable Inserts | HSS End-Milling Cutters |
| Inv | 1 | 8 | 16 | 0.5 | 50 | 1.5 | 6.6 | 55.2 |
| | 2 | 8 | 16 | 0.5 | 50 | 8.2 | 8.6 | 60.1 |
| Expls. | 3 | 8 | 16 | 0.1 | 50 | 1.5 | 9.8 | 58.2 |
| | 4 | 8 | 16 | 0.1 | 50 | 8.2 | 15.8 | 48.8 |
| | 5 | 13 | 26 | 0.5 | 100 | 8.2 | 23.1 | 90.2 |
| | 6 | 5 | 10 | 0.5 | 100 | 6.3 | 4.0 | 33.5 |
| | 7 | 3 | 8 | 0.5 | 100 | 6.3 | 2.5 | 25.2 |
| | 8 | 10 | 20 | 0.1 | 50 | 10.2 | 9.2 | 56.0 |
| | 9 | 10 | 20 | 0.1 | 50 | 15.1 | 12.5 | 55.0 |
| | 10 | 10 | 40 | 0.1 | 50 | 15.1 | 15.1 | 56.0 |
| | 11 | 8 | 16 | 0.5 | 45 | 5.5 | 6.5 | 55.0 |
| | 12 | 8 | 16 | 0.5 | 15 | 6.8 | 9.5 | 62.1 |
| | 13 | 8 | 16 | 0.5 | 100 | 12.5 | 15.1 | 75.1 |
| | 14 | 8 | 16 | 0.7 | 200 | 2.2 | 5.2 | 52.1 |
| | 15 | 8 | 16 | 0.7 | 400 | 1.3 | 4.3 | 42.1 |
| | 16 | 13 | 16 | 0.7 | 50 | 20.0 | 21.2 | 88.1 |
| Comp. | 17 | 3 | 1(TiN) | 0.5 | — | — | 0.8 | 8.3 |
| Expls. | 18 | 10 | 1(TiN) | 0.5 | — | — | 0.5 (Splitting Off) | 1.5 (Broken Out) |
| | 19 | 3 | 1(TiAl)N | — | — | 10.2 | 1.5 | 21.2 |
| | 20 | 10 | 1(TiAl)N | — | — | 10.2 | 0.5 | 10.2 (Broken Out) |
| | 21 | 3 | 1 (TiN) | 0.1 | — | — | 0.9 | 8.3 |
| | 22 | 8 | 1 (TiN) | 0.1 | — | — | 0.6 (Split Off) | Split Off After Coating |
| | 23 | 3 | 1 (TiAl) N | — | — | 6.8 | 1.4 | 20.5 |
| | 24 | 8 | 1 (TiAl)N | — | — | 6.8 | 0.2 (Split Off) | 2.5 (Split Off) |

As can clearly be seen in Table 2, by providing the transition layer with a thickness between 5 and 500 nm, preferably between 10 nm and 400 nm, an even better service life is obtained.

On the workpiece according to the invention, thus, a wear protection layer system with increased layer thickness and service life can be provided, preferably applied through a reactive PVD process, if appropriate also a non-reactive PVD process, and as PVD processes are especially suitable, in particular cathodic arc vaporization and sputtering, carried out reactively as well as non-reactively. Essential on the workpiece according to the invention or its production processes is the realization of the differing privileged orientation on two successive layers with a transition layer, if appropriate, embedded between them. Therewith a workpiece with wear-protective coating is created whose wear protection layer system has a high degree of toughness and the total wear protection layer system thickness, starting from thin layer systems up to thick ones, can be selected and therewith, in any event, the service life of such workpieces and in particular tools, compared to equally thick workpieces with monolayer wear-protective coating can be substantially increased.

Reference is made to the fact that the priority documents, according to the Japanese Applications No. 8-252384, Sep. 3, 1996

No. 8-252385, Sep. 3, 1996 are intended to form an integrated component of this application.

What is claimed is:

1. A method for manufacturing a workpiece with a wear protective coating, comprising the steps of depositing on a base body of said workpiece a first hard material layer made of a material selected from the group consisting of TiN, TiCN, TiAlN, TiAlCN;

depositing above said first hard material layer a second hard material layer made of a material selected from the group consisting of TiN, TiCN, TiAlN, TiAlCN;

thereby depositing said second hard material layer either directly upon said first hard material layer or depositing a transition layer between said first and said second hard material layers, said transition layer being deposited of a material composed of said materials of said first and of said second hard material layers, thereby depositing said transition layer with a thickness of between 5 nm and 500 nm; and depositing said first and second hard material layers so as to have the same crystal structure, but different crystallographic privileged orientation in said layers, thereby selecting a value I(200)/I(111) between an intensity of the (111) plane, I(111), and an intensity of the (200) plane, I(200), of one of said first and second hard material layers to be at most 1 and said value of the other of said first and second hard material layers to be at least 1, said values being selected to be different from each other.

2. The method of claim 1, further comprising the step of selecting the materials for said first hard material layer and for said second hard material layer to be different materials.

3. The method of claim 1, further comprising the step of selecting the materials of said first and of said second hard material layers to be one of: TiN and TiAlN, or TiCN and TiAlCN, or TiN and TiAlCN, or TiCN and TiAlN respectively, in any order.

4. The method of claim 1, further comprising depositing a mono-layer forming at least one of said first and of said second hard material layers to have a thickness of at most 2 μm.

5. The method of claim 1, further comprising the step of selecting the total thickness of said wear protective coating to be at least 1 μm.

6. The method of claim 5, thereby selecting said thickness to be at most 15 μm.

7. The method of claim 1, further comprising the step of depositing more than two of said first and second hard material layers in said wear protective coating.

8. The method of claim 1, wherein said workpiece has a workpiece body of steel or of a hard metal.

9. The method of claim 1, wherein said workpiece manufactured is one of a press tool, an indexable insert endmillig tool, a drill, a milling cutter, a gear cutting tool, a saw blade.

10. The method of claim 1, further comprising performing deposition of said first and of said second hard material layers by means of a PVD process.

11. The method of claim 10, further comprising performing said PVD process as a reactive PVD process.

12. The method of claim 10, wherein said PVD process is selected to be one of cathodic arc vaporization or of sputtering.

13. The method of claim 1, thereby depositing said transition layer with a thickness of between 10 nm and 400 nm.

14. A method for manufacturing a workpiece with a wear protective hard material coating system, comprising the steps of depositing on a workpiece body two subsequent layers of said system having different crystallographic privileged orientation, one privileged orientation being in the (111) plane, the second privileged orientation being in the (200) plane, thereby construing said system exclusively from respectively two or more than two of said first and second layers and depositing said first and second layers by a PVD process, and selecting a value I(200)/I(111) between an intensity of (111) plane, I(111) and an intensity of (200) plane, I(200) of one of said first and second layers to be at most 1, said value of the other of said first and second hard materials layers to be at least 1.

15. The method of claim 14, further comprising the steps of:
depositing said first layer of a material selected from the group consisting of TiN, TiCN, TiAlN, TAlCN; and
depositing said second layer made of a material selected from the group consisting of TiN, TiCN, TiAlN, TAlCN.

16. The method of claim 14, further comprising the step of depositing between said first and said second layers a transition layer being made of the materials of said first and second hard material layers.

17. The method of claim 16, further comprising the step of depositing said transition layer with a thickness of between 5 nm and 500 nm.

18. The method of claim 17, further comprising selecting said thickness to be between 10 nm and 400 nm.

19. The method of claim 14, further comprising the step of selecting the materials of said first and of said second layers to be different materials.

20. The method of claim 14, further comprising the step of selecting the materials of said first and of said second hard material layers to be one of: TiN and TiAlN, or TiCN and TiAlCN, or TiN and TiAlCN, or TiCN and TiAlN, respectively, in any order.

21. The method of claim 14, further comprising the step of selecting the materials of said first and of said second layers to be the same materials.

22. The method of claim 14, further comprising the step of selecting a thickness of a mono-layer forming at least one of said first and of said second layers to be at most 2 μm.

23. The method of claim 14, further comprising the step of depositing said system with a thickness of at least 1 μm.

24. The method of claim 23, further comprising the step of depositing said system with a thickness of at most 15 μn.

25. The method of claim 14, further comprising the step of depositing more than two of said first and of said second layers.

26. The method of claim 14, wherein said base body of said workpiece is of steel or of a hard material.

27. The method of claim 14, wherein said workpiece is one of a press tool, an indexable insert end milling tool, a drill, a milling cutter, a gear cutting tool, a saw blade.

28. The method of claim 14, wherein said first and second layers are deposited by a reactive PVD process.

29. The method of claim 14, further comprising the step of selecting one of cathodic arc vaporization and of sputtering as said PVD process.

30. The method of claim 14, said workpiece being one of a press tool, an indexable insert end milling tool, a drill, a milling cutter, a gear cutting tool, a saw blade.

31. The method of claim 14, further comprising the step of depositing said first and second hard material layers by one of cathodic arc vaporization and of sputtering.

32. A method for manufacturing a workpiece with a wear protective coating, comprising the step of depositing at least a first and a second hard material layers, one of which being of TiN, the other of which being of TiAlN and further depositing said TiN so that a value I(200)/I(111) between an intensity of the (111) plane, I(111), and an intensity of the (200) plane, I(200), is at most 0.7 and depositing said TiAlN so that said value is at least 1.3.

33. The method of claim 32, further comprising the step of depositing between said first and second hard material layers a transition layer being made of the material of said first and of said second hard material layer.

34. The method of claim 33, wherein said transition layer is deposited with a thickness of between 5 nm and 500 nm.

35. The method of claim 33, further comprising the step of depositing said transition layer with a thickness of between 10 nm and 400 nm.

36. The method of claim 32, further comprising the step of depositing each of said first and of said second hard material layers with a thickness of at most 2 μm.

37. The method of claim 32, further comprising the step of depositing said system with an overall thickness of at least 1 μm.

38. The method of claim 37, further comprising the step of depositing said system with an overall thickness of at most 15 μm.

39. The method of claim 32, further comprising the step of depositing more than two of said first and second layers.

40. The method of claim 32, further comprising the step of selecting a base body of said workpiece to be of one of steel and of a hard metal.

41. The method of claim 31, further comprising the step of depositing said first and second hard material layers by a PVD process.

42. The method of claim 41, further comprising the step of depositing said first and second hard material layers by a reactive PVD process.

* * * * *

UNITED STATES PATENT AND TRADEMARK OFFICE
CERTIFICATE OF CORRECTION

PATENT NO.   : 6,558,749 B2
DATED        : May 6, 2003
INVENTOR(S)  : H. Braendle It is certified that error appears in the above-identified patent and that said Letters Patent is hereby corrected as shown below:

<u>Title page,</u>
Item [73], Assignee, please change the name of the Assignee from "Unakis Balzers AG" to -- Unaxis Balzers AG --.

Signed and Sealed this

Seventh Day of October, 2003

JAMES E. ROGAN
*Director of the United States Patent and Trademark Office*